(12) United States Patent
Raschke et al.

(10) Patent No.: US 9,478,450 B2
(45) Date of Patent: Oct. 25, 2016

(54) WAFER SHIPPER

(71) Applicant: ENTEGRIS, INC., Billerica, MA (US)

(72) Inventors: Russ V. Raschke, Chanhassen, MN (US); Barry Gregerson, Deephaven, MN (US); Jason Todd Steffens, Shakopee, MN (US)

(73) Assignee: ENTEGRIS, INC., Billerica, MA (US)

( * ) Notice: Subject to any disclaimer, the term of this patent is extended or adjusted under 35 U.S.C. 154(b) by 25 days.

(21) Appl. No.: 14/391,696

(22) PCT Filed: Apr. 9, 2013

(86) PCT No.: PCT/US2013/035846
§ 371 (c)(1),
(2) Date: Oct. 9, 2014

(87) PCT Pub. No.: WO2013/155113
PCT Pub. Date: Oct. 17, 2013

(65) Prior Publication Data
US 2015/0068949 A1    Mar. 12, 2015

Related U.S. Application Data

(60) Provisional application No. 61/621,777, filed on Apr. 9, 2012.

(51) Int. Cl.
*B65D 85/30* (2006.01)
*B65D 85/00* (2006.01)
*H01L 21/673* (2006.01)

(52) U.S. Cl.
CPC ... *H01L 21/67369* (2013.01); *H01L 21/67383* (2013.01); *H01L 21/67386* (2013.01)

(58) Field of Classification Search
CPC ............... H01L 21/67369; H01L 21/6732; H01L 21/67326; H01L 21/67383; H01L 21/67386; Y10S 206/832; B29C 45/16; B65D 25/107

USPC ............. 206/710, 711, 454, 587; 211/41.18
See application file for complete search history.

(56) References Cited

U.S. PATENT DOCUMENTS 4,793,488 A    12/1988  Gregerson
4,842,136 A *  6/1989  Nakazato ................. G03F 1/66
                                                        16/48.5

(Continued)

FOREIGN PATENT DOCUMENTS

EP           1 394 850 A1    3/2004
WO    WO 2005/081781 A2    9/2005

(Continued)

*Primary Examiner* — Chun Cheung
(74) *Attorney, Agent, or Firm* — Wilmer Cutler Pickering Hale and Dorr LLP

(57) ABSTRACT

A wafer container for holding a spaced stack of thin wafers, comprising an H-bar carrier, a base portion for receiving same, a base wafer cushion attached at the bottom wall positioned below the H-bar carrier, the cushion having a plurality of ribs defining slots each with a bottom wafer seating region having a curvature and a pair of ends, each of the ends having a flare whereby the seating region flares outwardly at the ends, a cover portion that connects with the base portion to form a closed interior. The cover portion having an uppermost wall a wafer cushion secured thereto. The cover wafer cushion having a row of wafer engaging finger portions, the finger portions Y shaped and having two legs extending from a support portion and alternatingly extending from opposing support portions, the finger portions may be S shaped with a wafer pad flared in two direction.

21 Claims, 10 Drawing Sheets

(56) References Cited

U.S. PATENT DOCUMENTS

| | | |
|---|---|---|
| 4,949,848 A | 8/1990 | Kos |
| 4,966,284 A | 10/1990 | Gregerson et al. |
| 5,228,568 A | 7/1993 | Ogino et al. |
| 5,273,159 A | 12/1993 | Gregerson |
| 5,555,981 A * | 9/1996 | Gregerson ........ H01L 21/67369 206/454 |
| 5,782,362 A | 7/1998 | Ohori |
| 5,992,638 A * | 11/1999 | Gregerson ........ H01L 21/67369 206/454 |
| 6,082,540 A | 7/2000 | Krampotich et al. |
| 6,591,987 B2 | 7/2003 | Wu et al. |
| 6,736,268 B2 | 5/2004 | Nyseth et al. |
| 6,951,284 B2 | 10/2005 | Cheesman et al. |
| 7,017,749 B2 * | 3/2006 | Yajima .............. H01L 21/67369 206/454 |
| 2001/0037986 A1 * | 11/2001 | Mendiola .......... H01L 21/67326 211/41.18 |
| 2003/0132133 A1 * | 7/2003 | Cheesman ........ H01L 21/67369 206/454 |
| 2006/0021904 A1 | 2/2006 | Matsutori et al. |

FOREIGN PATENT DOCUMENTS

| | | |
|---|---|---|
| WO | WO 2009/089552 A2 | 7/2009 |
| WO | WO 2011/113033 A2 | 9/2011 |

* cited by examiner

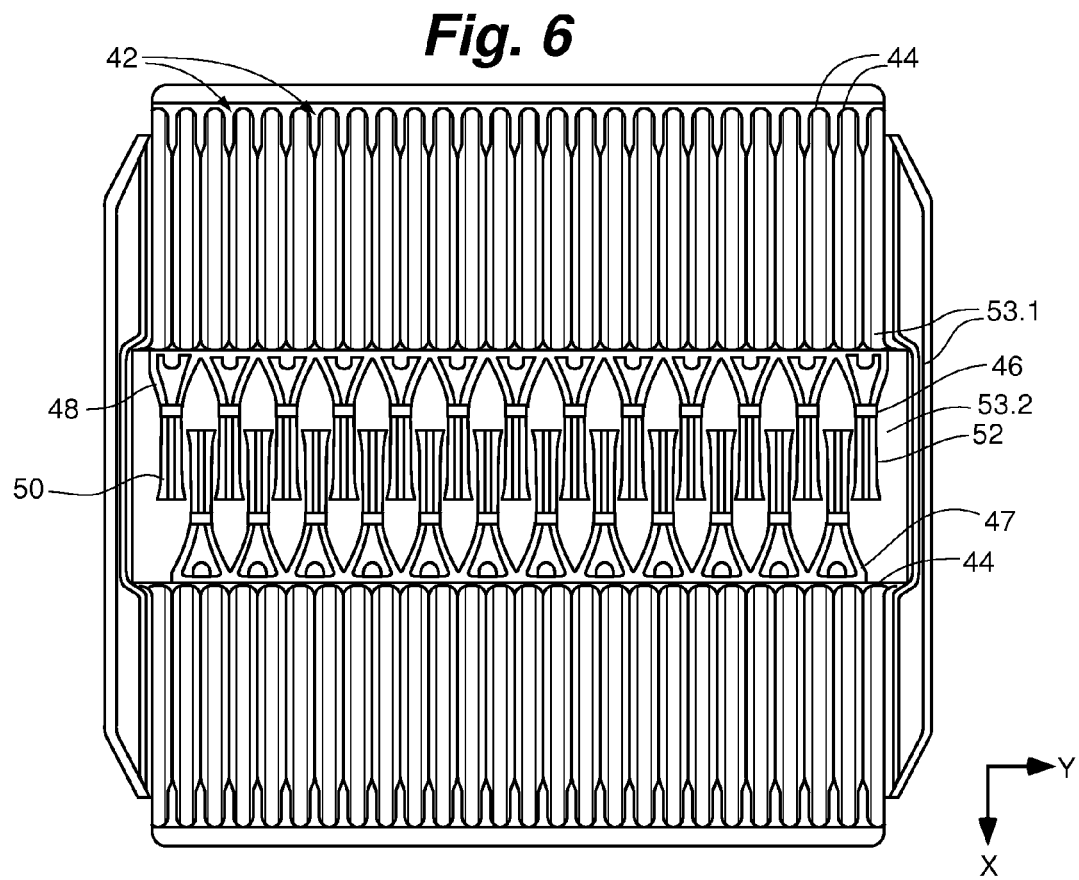
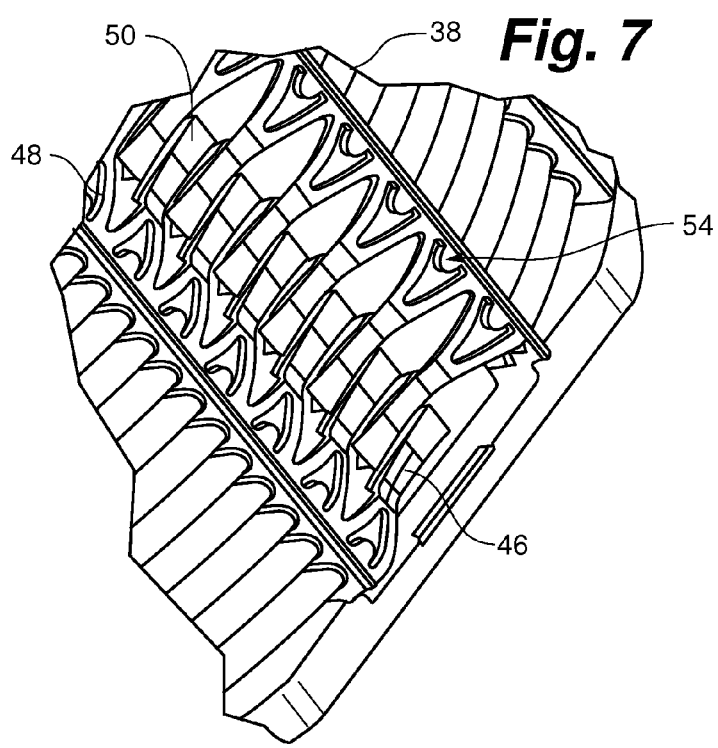

WAFER SHIPPER

RELATED APPLICATIONS

This present application is a National Phase entry of PCT Application No. PCT/US2013/035846, filed Apr. 9, 2013, which claims priority to U.S. Provisional Application No. 61/621,777, filed Apr. 9, 2012, the disclosures of which are incorporated by reference in their entirety.

FIELD OF THE INVENTION

The present invention relates generally to containers for carrying substrates and semiconductor wafers, and the like. More particularly, the present invention relates to an improved wafer support mechanism in a wafer container useful for carrying a plurality of axially aligned thin mostly circular wafer substrates.

BACKGROUND OF THE INVENTION

For years, manufacturers have produced special containers for transporting and storing substrates and semiconductor wafers, and the like. Due to the delicate nature of the wafers and their extreme value, it is vital that they are properly protected throughout the transportation process. Since the handling of wafers is generally automated, it is necessary for wafers to be precisely positioned relative to the handling equipment for the robotic removal and insertion.

In addition to protection from damage by breakage, cleanliness and contamination control is critical in shipping storing or processing semiconductor wafers. The components and materials utilized must be very clean in the sense of not shedding or minimal shedding of particles and not exuding contaminants, such as gases, that can form film layers on the wafers. The containers and components are typically reused and must be amenable to cleaning and must be able to withstand repeated washing and drying cycles. Additionally, it is also critical, due to the commodity nature of wafer containers, particularly shippers for 100 mm and 150 mm wafers, that the containers are inexpensively manufactured and inexpensively maintained, such as replacement of component parts.

Conventional wafer shippers, particularly for 100 mm and 150 mm wafers, comprise a wafer cassette, which holds a plurality of semiconductor wafers, contained in a wafer cassette container. The combination protects the wafers from mechanical damage and contamination during the storage and transportation. See for example, U.S. Pat. Nos. 4,949, 848; 4,966,284; 4,793,488; and 5,273,159 for exemplary prior art wafer shippers. These patents are owned by the owner of the instant invention and are incorporated by reference herein.

The conventional wafer cassette is a single molded part generally comprising a front end having an H-bar machine interface portion, a back end having a panel, and sidewalls having slots comprising lower curved or converging portions following the curvature of the wafers, and with an open top and open bottom such as the device disclosed in U.S. Pat. No. 5,782,362 hereby fully incorporated herein by reference.

Recently, the semiconductor industry has begun using wafers having a very thin cross sectional dimension. The thickness of these thin silicon wafers can be as thin as 200 μm, in contrast with a typical conventional SEMI standard wafer thickness. Also, a thin germanium wafer thickness can be 125 μm. Thin wafers present unique design considerations, and cassette style shippers are unsatisfactory in several respects for use with the thinner wafers. Thin wafers can be considered any wafer thickness that is less than the SEMI standard nominal thickness for wafers.

Another characteristic of thin wafers is that they can be substantially more fragile and prone to physical damage than a standard wafer. A conventional wafer carrier having limited support for the wafer around the extreme periphery of the wafer, causes increased stresses during shock events. The stress created makes the wafer even more prone to physical damage from shock or vibration.

The edges of thin wafers can be very sharp, and are formed from very hard materials, like silicon and germanium. These sharp edges can get caught on the cushion when the cover is installed causing cross-slotting and potentially causing damage to the wafer. Additionally, thin wafers may cut through softer materials that come into contact with the peripheral edge of the wafer, for example the wafer carrier plastic material.

Although existing containers are designed to reduce the effects of physical shock which can damage thin and fragile wafers, wafer containers are needed with improved shock reducing properties. There is a need for a wafer carrier specifically designed to be suitable for use with very thin wafers, in particular to accommodate their increased fragility while maintaining low manufacturing cost.

One such improved container is disclosed in PCT Application Publication No. 2011/113033, which is hereby incorporated by reference. Although this container provides significant advantages over the previous art making it suitable for use with thin wafers, further enhancements for wafer protection are desirable.

SUMMARY OF THE INVENTION

The invention as depicted is an embodiment of an improved wafer container for use in transporting, storing or processing thin data semiconductor wafers or other thin substrates. Wafer container includes a cassette portion placed into a two-piece container portion for transport. This container portion comprises a top cover which attaches to a bottom cover with a juncture at about the middle of the cassette. Each of the top cover and base portion having a depth substantially the same. The top and bottom covers each include a cushion assembly which is designed to ensure that the wafers do not cross-slot and that they are sufficiently held in place during transportation to avoid damage. The upper cushion can include wafer engagement ribs that define slots for wafers on opposing sides of the cushion. A finger portion can extends from pairs of ribs on alternating sides of the cushion such that each finger portion extends from an opposite side of the cushion than adjacent finger portions. Finger portions have a proximal portion, a mid portion, and a distal portion and can define a generally Y-shaped configuration including a pad having a slot for seating a wafer and a forked portion, having two legs extending from the ribbed portion or a support portion. to the pad or a mid portion.

A feature and advantage of embodiments of the present invention is an upper cushion that includes fingers having a forked portion extending from wafer engagement ribs and a pad having a slot for a wafer. Forked portion extends from ribs at two spaced apart locations, providing a wider base for finger. Fingers extend from alternate sides of the cushion so that forked portion can have an increased width up to the width of a pair of ribs. Forked portion, that is, the proximal portion provides a wider base that results in greater resistance to both torsional forces about the wafer engagement pad and forces that extend transverse to the circumferential engagement of the wafer with the pad. In other words, forces generally parallel to the axis of the stack of wafers. This enhanced force resistance provides enhanced wafer protection whilst still providing the relatively delicate resistance in the radial direction, the z direction, toward the axis of the stack of wafers.

A feature and advantage of embodiments of the present invention are cantilevered elongate fingers, each having a front side that faces and confronts the wafers prior to engagement with the wafer edges, a back side opposite the front side, and lateral sides. Each finger having at least one lateral side that confronts the lateral side of an adjacent finger in the row of fingers.

A feature and advantage of embodiments of the present invention are cantilevered elongate fingers, when viewed from their front side having a Y shape, with upper legs of the Y each connecting to an axially extending support member and the lower leg of the Y being cantilevered outwardly and providing a wafer engaging pad for engaging the forward edges of the wafers.

A feature and advantage of embodiments of the present invention are cantilevered elongate fingers that have a proximal portion, a narrowed neck or mid portion, and a flared distal portion. The width, measured in the direction parallel to the axis of the stack of wafers, of the fingers is narrowest at the neck portion and widest at the proximal portion adjacent the rail to which it connects. The flared distal portion defining a wafer engaging pad with a distal tip of the pad the furthermost forward, that is towards the wafer engagement direction, of any portion of the finger. The depth of the finger, measured in a direction perpendicular to the axis of the stack of wafers, being the greatest at the distal tip. The width of the wafer engagement pad, measured in the direction parallel to the axis of the stack of wafers, being the greatest at the distal end. In embodiments of the invention the shape of the elongate fingers, when viewed from the front or back, can be said to be bow tie shaped.

A feature and advantage of embodiments of the present invention are cantilevered elongate fingers that have a proximal portion, a narrowed neck or mid portion, and a flared distal portion. The fingers being arranged in a row for engaging the stack of wafers, each of the flared distal portions being arranged to alternate in the flare direction; that is one finger has the distal portion extending and flaring to a right side, the sequential next has its distal portion extending towards and flaring to a left side, the sequential next to the right, and so on.

Another feature and advantage of embodiments of the present invention is fingers having a pad that flares outwardly towards a distal end of pad. Flared portion of a specific finger occupies the space between adjacent narrowed portions of the fingers adjacent to the specific finger, and therefore reduces cross-slotting by reducing the likelihood of wafers being disposed in the space between pads. Wafers are instead guided into the wafer slots on pads to be properly seated.

A feature and advantage of embodiments of the invention is that the proximal portion of each cantilevered wafer engagement finger comprises two legs that provide an enhanced resistance of rotation of the wafer engagement pad about an axis extending the length of the finger, as well as providing a reduction in the forward rearward pressure of engaging the wafers, making the configuration ideally suited to the more fragile thin wafers of 200 µm or less.

A feature and advantage of embodiments of the present invention are cantilevered elongate fingers that have a proximal portion, a mid portion, and a distal portion, the distal portion comprising a pad for engaging a peripheral edge of a wafer and wherein each wafer finger having an S-shape with the proximal portion having a concave curvature facing forwardly, that is, the direction of wafer engagement, and the distal portion having a convex curvature facing forwardly. The curvature increases the resistance to torsional rotation of the elongate finger whilst not affecting or reducing the resistance to forces in the direction of the wafer engagement, the z direction.

A feature and advantage of embodiments of the present invention is wafer slots in bottom cushion that include a flared portion at the ends of slots. As each slot approaches the edge of the cushion, the slot flares outwardly at an angle to provide a wider surface between adjacent wafer engagement ribs that define the slot. Flared portion can define a generally Y-shaped configuration between adjacent ribs at the end of slots. The wider end surface provided by flared portion can help guide the wafer into the slot to prevent cross slotting and also results in a sturdier cushion that provides more stable wafer support. The gradual flare compared to the more abrupt ending of the ribs of a conventional slot allows for support of a flexed wafer that has some flex right at the end of the slot, this provides greater shock protection that the conventional abrupt slot termination. The portion of the wafer that bends is essentially spread out over a greater circumferential length of the wafer reducing the stress on the wafer at the end of the slot. The flared slot portion may begin its flaring at a distance from the end of the ribs at least about the distance between adjacent ribs, or the pitch. The ribs and slots of the upper wafer cushion may also have the flared portion.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 6 is a bottom plan view of the portion of the wafer shipper of FIG. 4.

FIG. 7 is a partial view of the portion of the wafer shipper of FIG. 4.

DETAILED DESCRIPTION OF THE INVENTION

Figure 1:
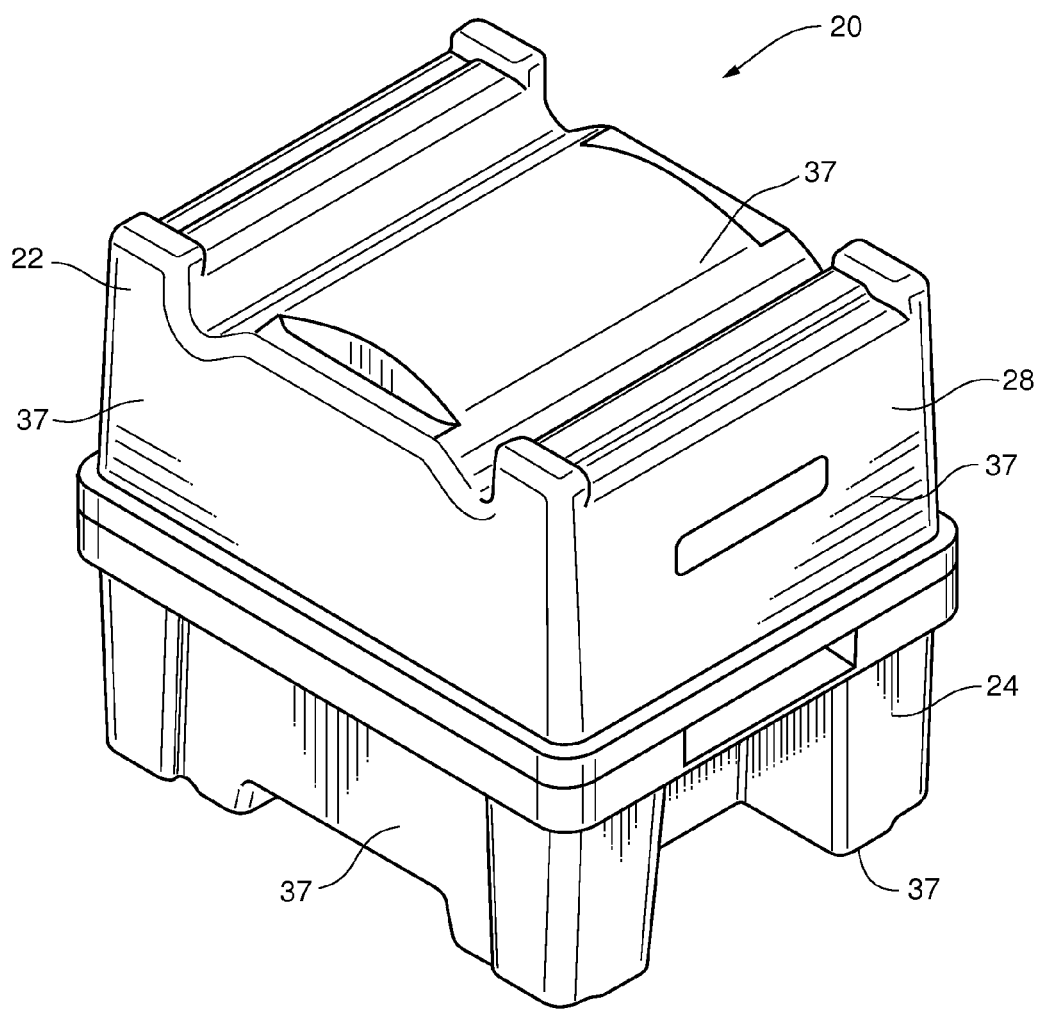
FIG. 1 is a perspective view of a wafer shipper according to an embodiment of the present invention.
Figure 2:
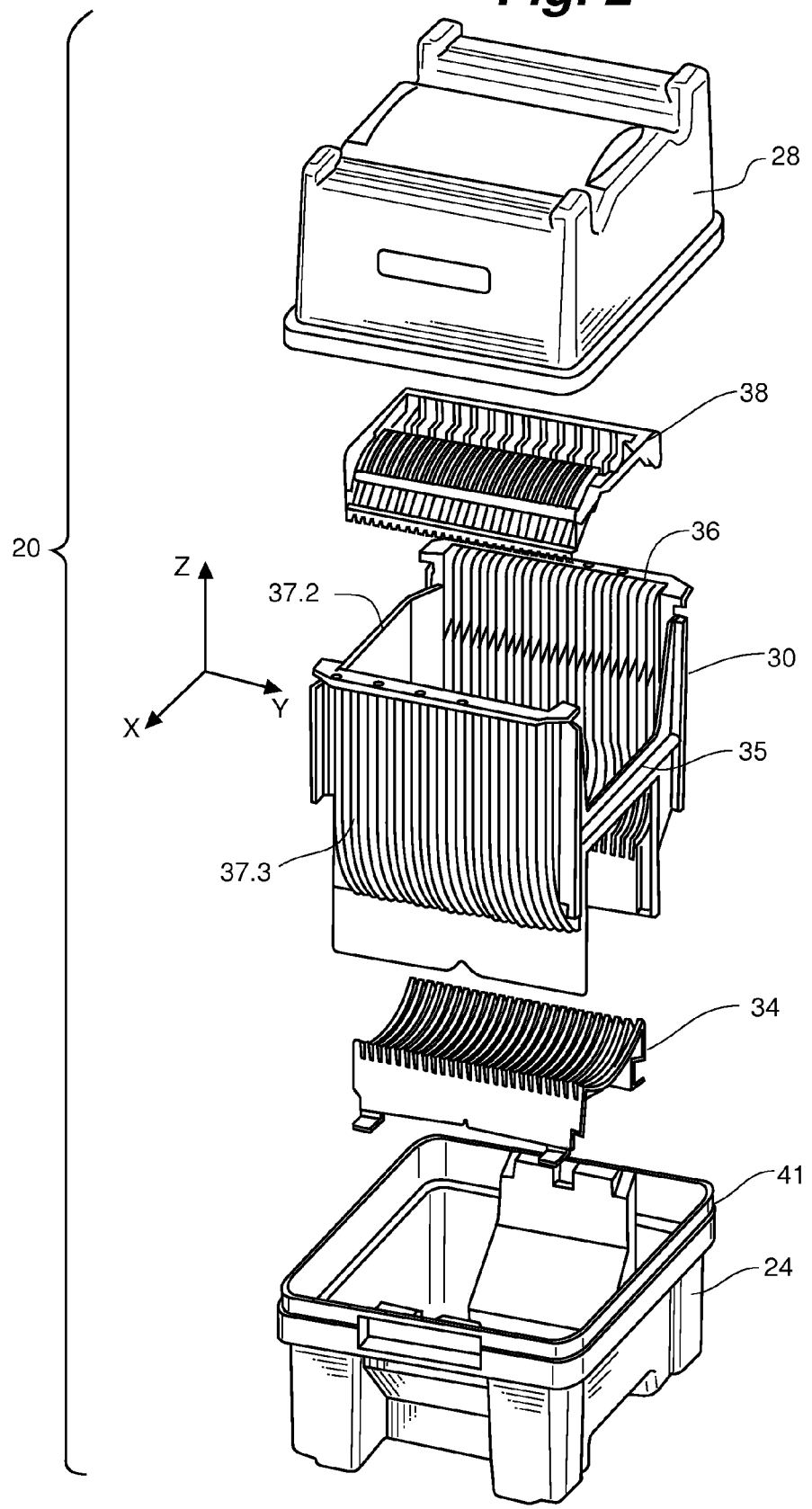
FIG. 2 is an exploded view of a wafer shipper according to an embodiment of the present invention.
Figure 3:
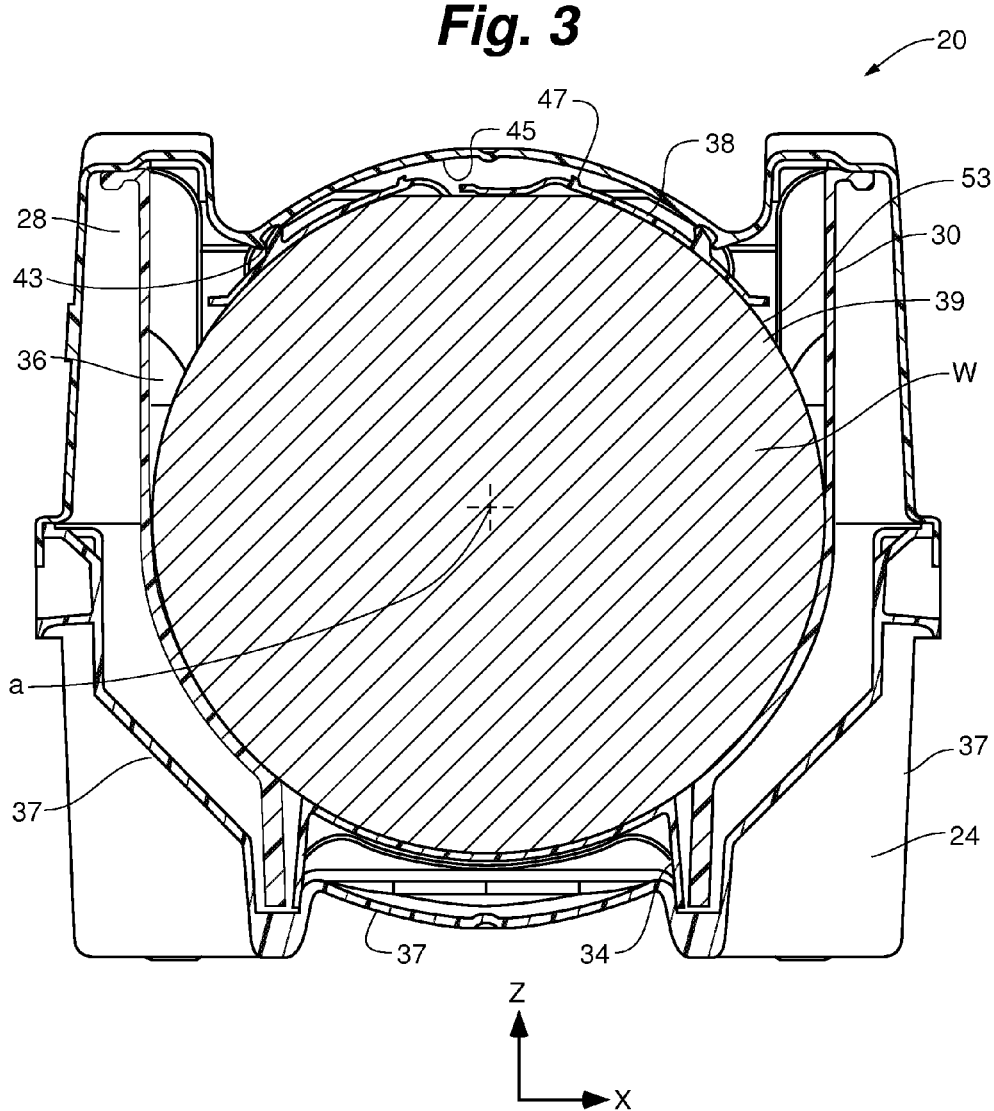
FIG. 3 is a cross sectional view of the wafer shipper of FIG. 1.
Figure 4:
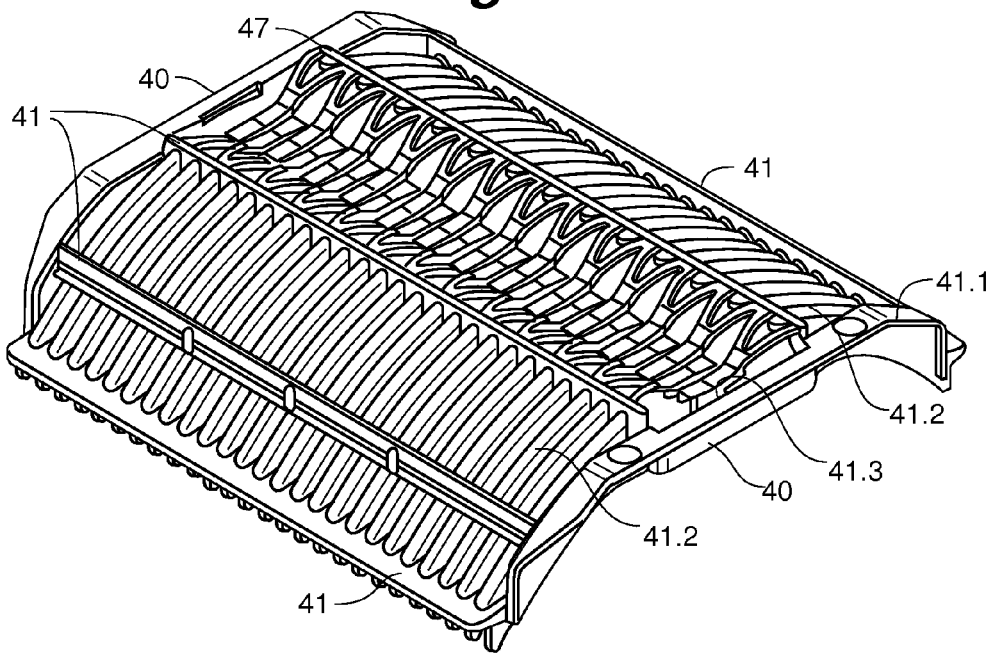
FIG. 4 is a top perspective view of a portion of a wafer shipper according to an embodiment of the present invention.
Figure 5:
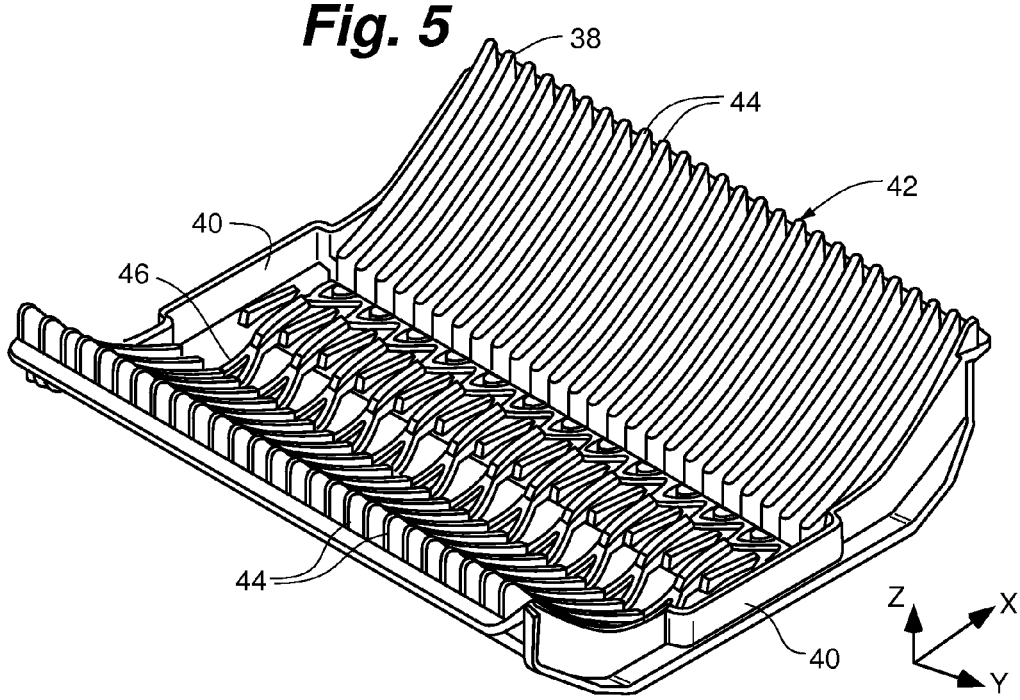
FIG. 5 is a bottom perspective view of the portion of the wafer shipper of FIG. 4.

Referring to FIGS. 1, 2, and 3, a wafer shipper 20 according to an embodiment of the invention is illustrated and is comprised generally of a container portion 22 comprising a base portion 24 and a top cover portion 28, a cassette 30, a lower cushion 34, and an upper cushion 38. The base portion and top cover portions comprise pluralities of walls 37. Consistent with normal convention, the wafers are inserted and removed in the z direction, and the y direction is parallel to the axis a of the stack 39 of wafers W, one of which is illustrated in FIG. 3. The slots are aligned in the x direction. As can be seen in FIG. 3, lower cushion 34 and cassette 30, known as an H-bar carrier or cassette, are positioned in base portion 24 to receive wafers W. The H-bar carrier has an H-bar 35, teeth 36, an open bottom 37, end wall 37.2, and side walls 37.3. Upper cushion 38 can be mounted in cover portion 28, and engages the wafers W when the cover portion 28 is positioned on the base portion 24. The top cover engages the edge portion 41 of the base portion when closed.

Referring to FIGS. 3-9, details of the upper cushion 38 of a wafer shipper 20 according to an embodiment of the present invention are shown. Upper cushion 38 can include a pair of end rails 40 that extend generally in a circumferential direction, or generally parallel to the plane of the wafers, the z-y plane. Support portions or rails 41 also extend in the x direction, parallel with the axis of the stack of wafers. The rails form framework 41.1 providing a support and attachment structure, supporting the two rows 41.2 of ribs and the row 41.3 of finger portions and allowing attachment to attachment structure 43 at the inside top surface 45 of the cover. The sections of ribs are, in the embodiment illustrated, have ribs integral and connected to one another without gaps there between, that is no openings. The ribs define the plurality of wafer slots 42 therein for receiving wafers therebetween. In one embodiment, slots 42 have a generally V-shaped configuration that face and confront the wafers as the cover is put on the base portion. Each wafer slot 42 is defined between a pair of adjacent ribs 44. Slots 42 and ribs 44 can be arcuately shaped to follow the periphery of wafers. Ribs 44 can be disposed along opposing sides of cushion 38, with finger portions 46 extending between the ribs 44 on opposing sides, such as from a support portion configured as a support rail 47. Each finger portion 46 can have a generally Y-shaped configuration with a proximal portion 46.1, a mid-portion 46.2 or neck, and a distal portion 46.3. Each finger portion may include a forked portion 48, defined by the two upper legs 49 of the "y" and as the proximal portion 46.1 extending from the elongate support rail 47 adjacent ribs 44. The two legs join at the mid portion, the mid portion leads to the distal portion, and the distal portion includes the wafer engagement pad 50. Pad 50 has a wafer slot 52 for accommodating the circumferential edge 53 of a wafer that is aligned with a slot 42 between ribs 44. In certain embodiments, the rib section can be the support portion for the finger portions. The support portions 53.1 form a window 53.2, see FIG. 6.

In embodiments, distal end of pad 50 can be flared with the maximum width at the tip 55 of the pad 50. The most forward, in the z direction, portion of the pad is also at or proximate the pad tip whereby the pad tapers towards the mid portion with respect to a width in the z direction and also with respect to a width in the y or circumferential direction. This double flared portion can help prevent wafers from slotting into the area between finger portions 46. Intermediate the two legs of the proximal portion, a pin pad 54 extending into the open area defined by forked portion 48 that aids in ejecting the cushion 38 from a mold when it is formed. At such a position, deformation of the pad during component ejection does not affect any critical dimensions or the functionality of the component.

Figure 8:
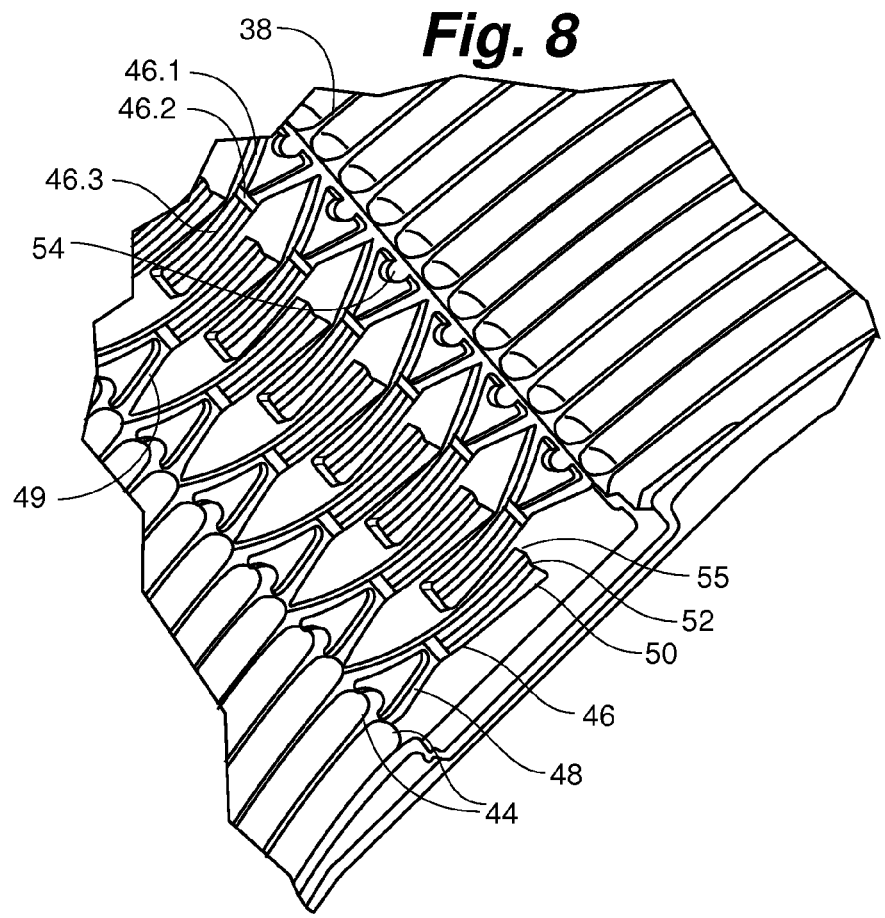
FIG. 8 is a partial view of the portion of the wafer shipper of FIG. 4.
Figure 9:
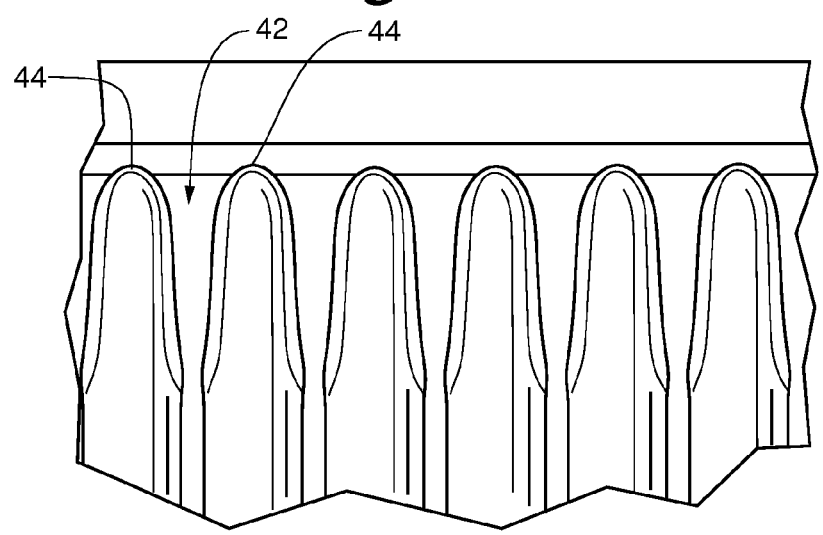
FIG. 9 is a partial view of the portion of the wafer shipper of FIG. 4.
Figure 10:
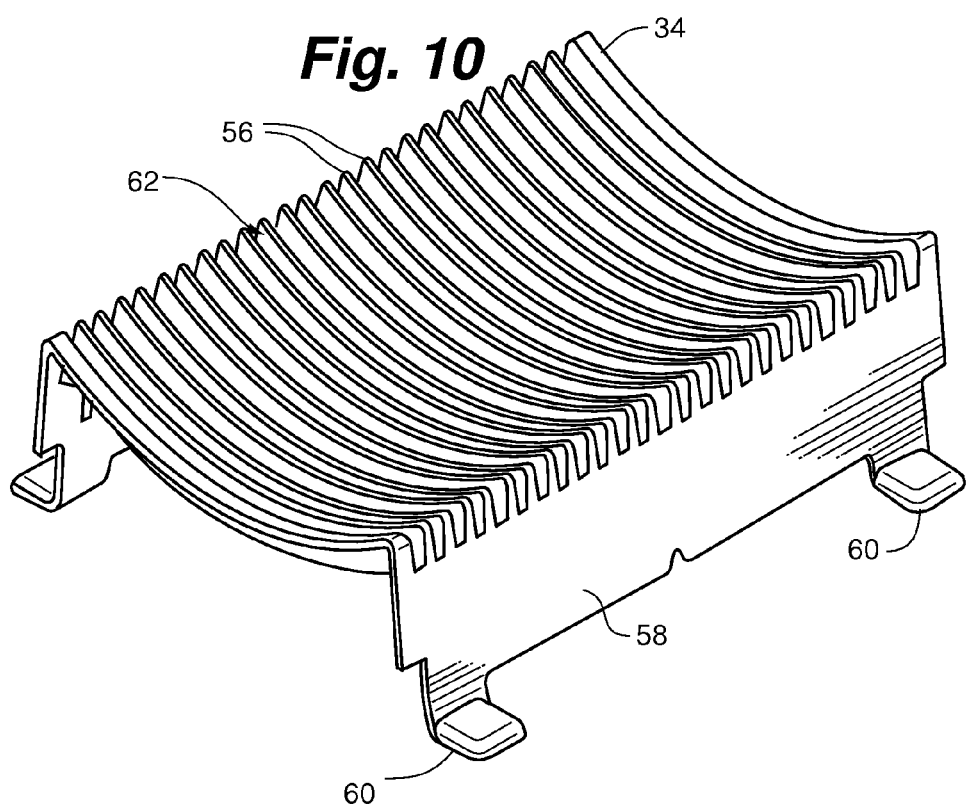
FIG. 10 is a top perspective view of a portion of a wafer shipper according to an embodiment of the present invention.
Figure 11:
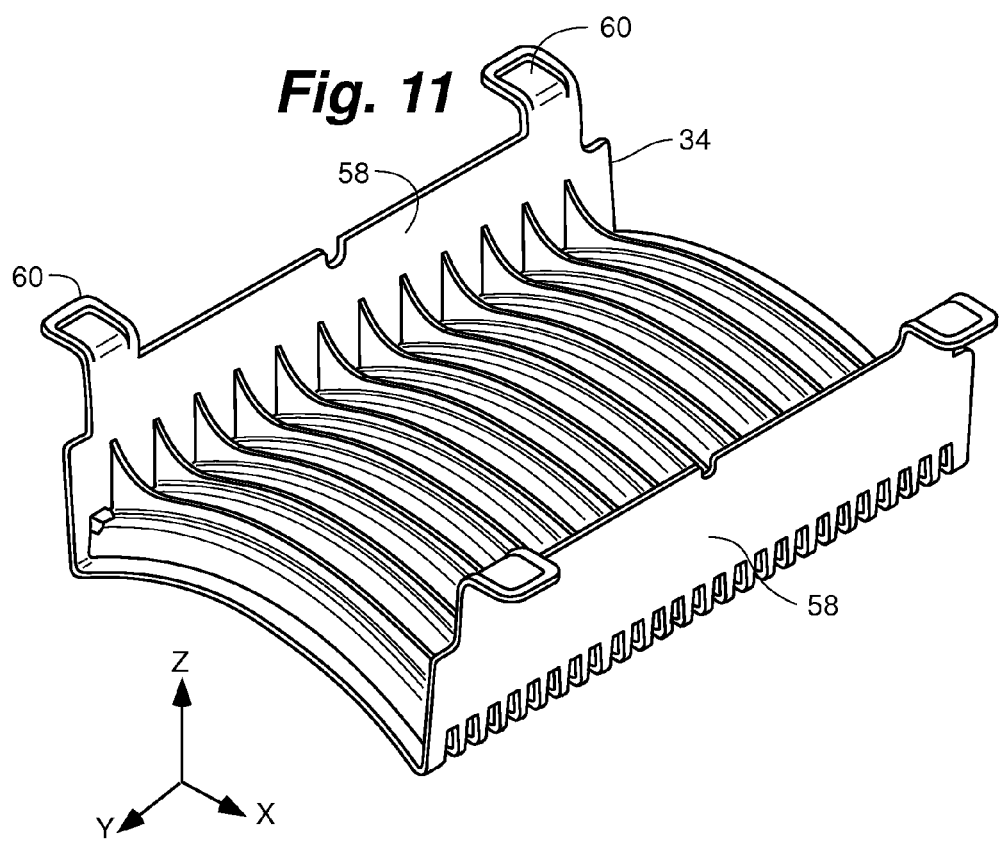
FIG. 11 is a bottom perspective view of the portion of the wafer shipper of FIG. 10.
Figure 13:
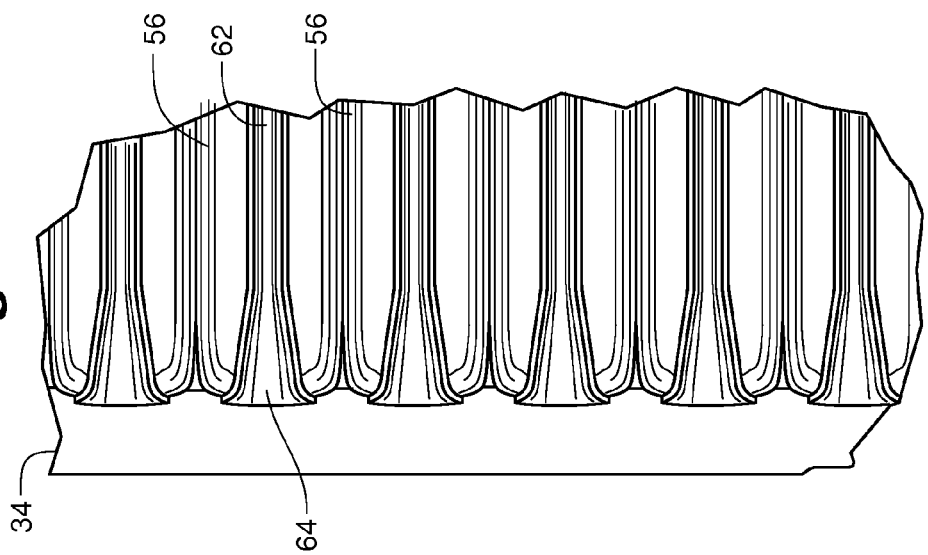
FIG. 13 is a partial view of the portion of the wafer shipper of FIG. 10.
Figure 12:
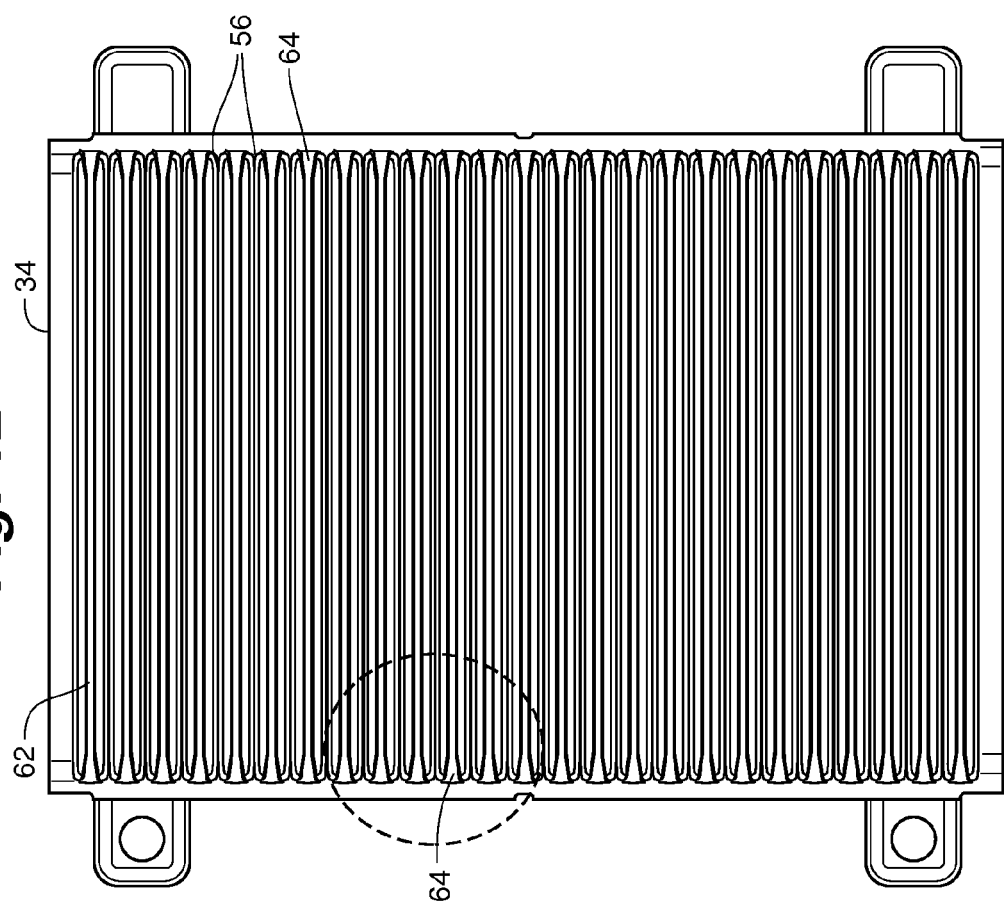
FIG. 12 is a top plan view of the portion of the wafer shipper of FIG. 10.
Figure 15:
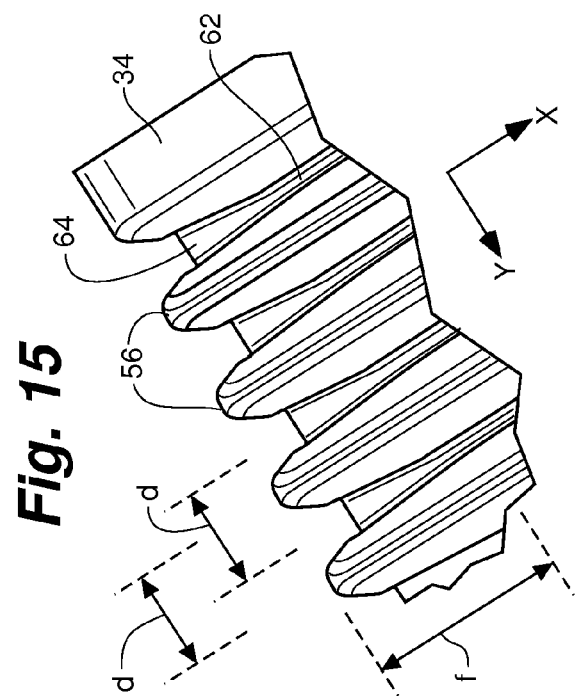
FIG. 15 is a partial view of the portion of the wafer shipper of FIG. 10.
Figure 14:
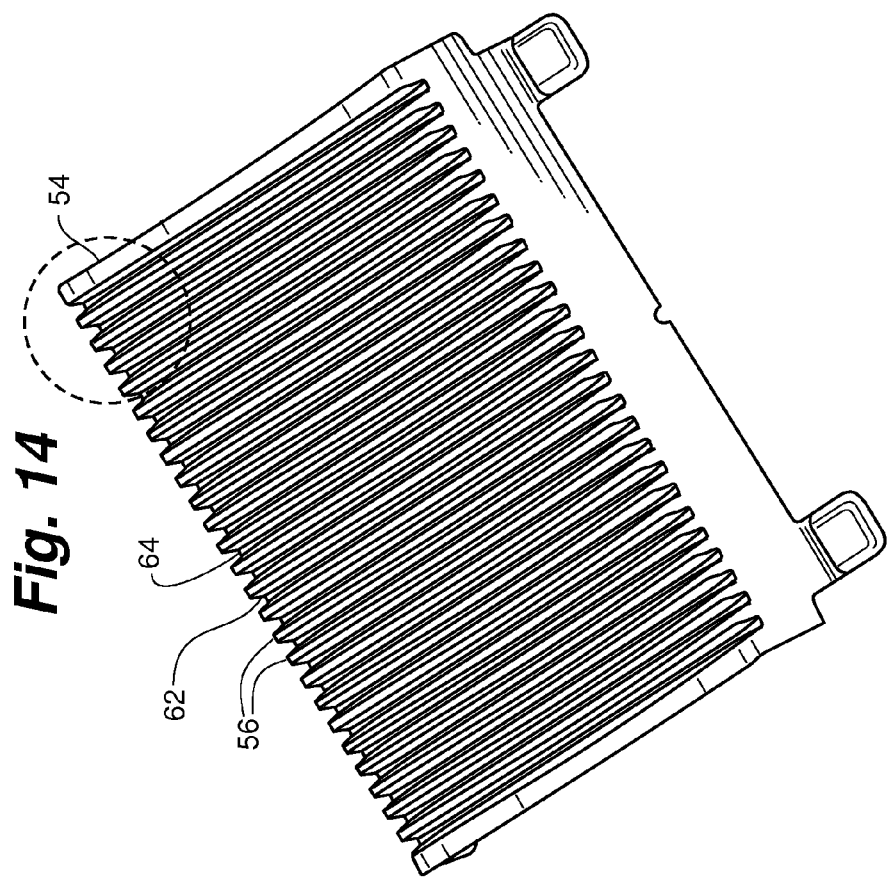
FIG. 14 is a perspective view of the portion of the wafer shipper of FIG. 10.
Figure 16:
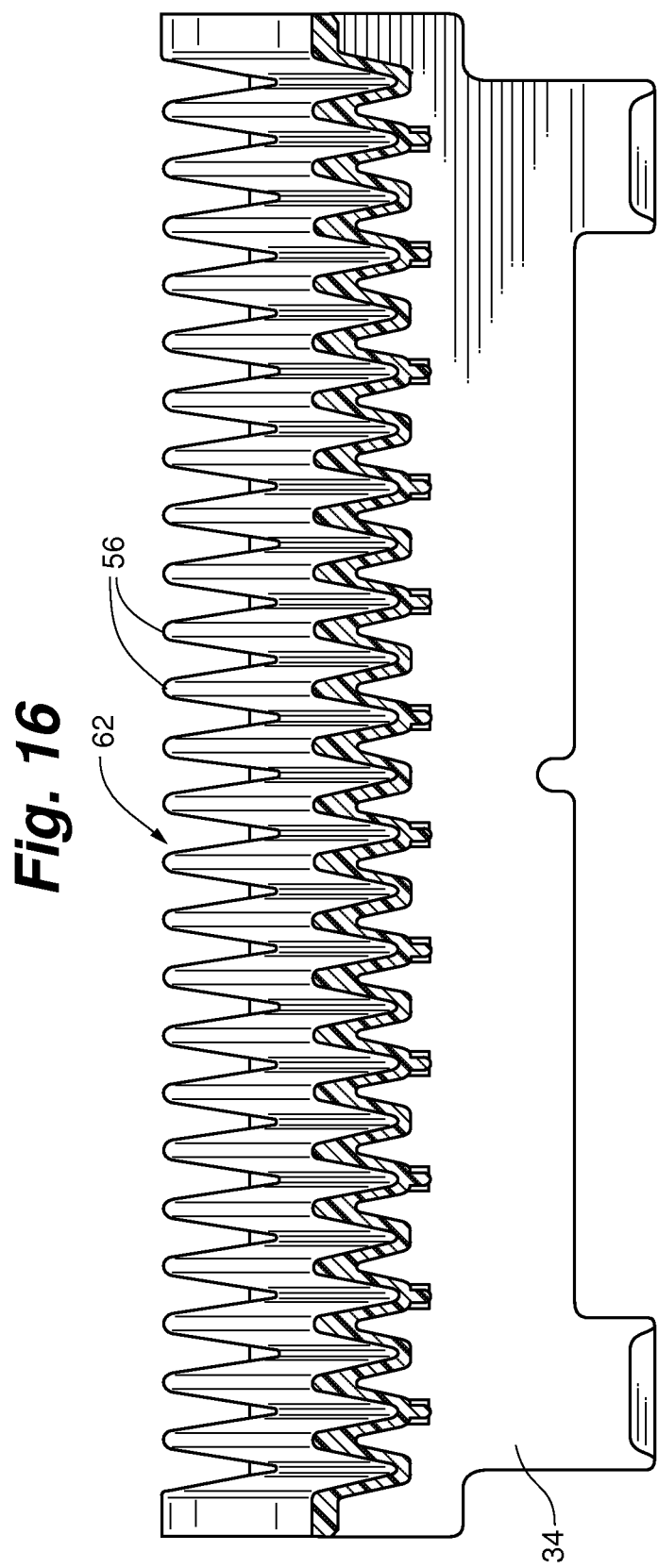
FIG. 16 is a cross-sectional view of the portion of the wafer shipper of FIG. 10.

As can be seen in FIGS. 6-8, finger portions 46 can be arranged in an alternating configuration such that every other finger portion 46 extends from opposite sides of the cushion 38. Thus, a wafer seating surface is defined by a slot 42 between a pair of ribs 44 on one side of the cushion 38, an aligned slot 42 between a pair of ribs 44 on the opposite side of the cushion 38 and a slot 52 defined in the Pad 50 of a finger portion 46 extending from adjacent one or the other sides. An adjacent seating surfaces is defined by adjacent slots 42 between ribs 44 and a slot 52 in a pad 50 of a finger portion 46 extending from the opposite side. This configuration allows for the forked portion 48 of finger portion 46 to be utilized with maximum width (in the x direction), because the alternating format allows for the forked portion 48 to have a greater width. In one embodiment, finger portion 46 has a width at its widest point proximate two ribs 44. Finger portion 46 according provides greater stability and shock absorption in that it provides greater resistance to both torsional forces and axial forces on cushion.

Referring now to FIGS. 10-16, a bottom cushion 34 of a wafer shipper 20 according to an embodiment of the present invention is depicted. Bottom cushion 34 includes a pair of rails 58 having arcuate wafer engagement portions 56 extending therebetween. Rails 58 include feet 60 for seating bottom cushion 34 within base portion 24 of wafer shipper. Slots 62 for seating wafers in bottom cushion 34 are defined between adjacent ribs 56. In one embodiment, slots 62 are defined by a generally V-shaped groove. As can be seen in FIGS. 12-15, wafer slots 62 can each include a flared portion 64 at each end of slots 62. In one embodiment, flared portions 64 define a generally Y-shaped configuration at the ends of each slot. Flared portions 64 provide a wider surface at the end most connection point between adjacent wafer engagement portions 56, which helps guide the wafer into the slot 62 to prevent cross slotting and also results in a sturdier cushion 34 that provides more stable wafer support. The flare is provided by a widening of the bottommost portion of the groove which is associated with narrowing of the ribs as the end of the ribs is approached. The angle of the two surfaces of the adjacent ribs defining the slot decrease as the measured position approaches the end of the rib. Such flaring may suitably be accomplished beginning at about a distance f from the rib ends that equals about the distance d, from rib peak to rib peak which is also equates to the distance between corresponding surfaces of wafers seated in adjacent slots, also knows as the wafer "pitch". Thus a flare is different than and offers more of a gradual taper of a rib than the a conventional rounding of the rib at the rib end.

The flare allows some deflection of the unsupported peripheral edge of the wafer and as the unsupported portion deflects, a portion of the unsupported portion becomes supported which spreads out the deflection point and spreads the stress along the wafer at the flared portion of the ribs rather than at a discrete point on the wafer at the end of the ribs. Deflection about the discrete point where the ribs end is believed to be much more conducive to overstressing and fracturing of the wafer than utilizing the flared slot as described above. Another description of the flaring is the thinning of the rib in the y direction as the end of the rib is approached a tapering. Again the taper may start at a distance about the pitch distance from the end of the rib.

Cushion assemblies 34, 38 provide additional support to the wafers W during transportation to minimize wafer damage from shock and vibration and rotation without adding additional secondary packaging. When the container top cover is installed, the additional wafer cushion assemblies also are able to guide the wafers into the optimum seating position inside the cassette to reduce the risk of the wafers cross-slotting during the loading operation and transit. The upper and lower peripheries of the wafers are in contact with center lines of respective V shaped wafer slots 42, 52 in the upper cushion 38 and the V shaped slots 62 in the lower cushion 34 so that each of the wafers is kept apart from its neighbor wafer, thus reducing the contact of wafers, thereby minimizing contamination of the wafer surface. Further, the elastic resilience of the cushion assembly serves to ensure correct positioning of the wafers when the upper periphery of the wafers contacts the cushion, the elastic cushion is bent archwise to effect movement of the periphery of the wafer into the center line of the V-shaped grooves. The elastic resilience of the cushion assembly exhibits a damping effect to the vibrations and mechanical shocks on the wafers during transportation of the wafer container so that the wafer contained therein can be protected from damage. Fingers 46 on upper cushion 38 further enhance this damping effect.

The components herein are conventionally formed by way of injection molding. The polymers may be polypropylene, polycarbonate, nylons, LCPs, and other polymers conventionally utilized in wafer containment structures.

The structures and features of similar containers are illustrated in U.S. Pat. Nos. 4,949,848; 4,966,284; 4,793,488; 5,273,159; 6,736,268 and PCT Application Publication Nos. WO 2011/113033; PCT/US2005/003220; and WO 2009/089552, such structures, materials, and features are suitable for use with the inventions described herein. These patents/publications are owned by the owner of the instant invention and are all incorporated by reference herein. The wafer engagement structures herein, although illustrated in the context of a shipping box, could also be applicable to front opening wafer containers for 300 mm and 450 mm wafers with the base portion being the container portion and the cover being the door that covers the opening of the container portion.

The above references in all sections of this application are herein incorporated by references in their entirety for all purposes.

All of the features disclosed in this specification (including the references incorporated by reference, including any accompanying claims, abstract and drawings), and/or all of the steps of any method or process so disclosed, may be combined in any combination, except combinations where at least some of such features and/or steps are mutually exclusive.

Each feature disclosed in this specification (including references incorporated by reference, any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment (s). The invention extends to any novel one, or any novel combination, of the features disclosed in this specification (including any incorporated by reference references, any accompanying claims, abstract and drawings), or to any novel one, or any novel combination, of the steps of any method or process so disclosed The above references in all sections of this application are herein incorporated by references in their entirety for all purposes.

Although specific examples have been illustrated and described herein, it will be appreciated by those of ordinary skill in the art that any arrangement calculated to achieve the same purpose could be substituted for the specific examples shown. This application is intended to cover adaptations or variations of the present subject matter. Therefore, it is intended that the invention be defined by the attached claims and their legal equivalents, as well as the following illustrative aspects. The above described aspects embodiments of the invention are merely descriptive of its principles and are not to be considered limiting. Further modifications of the invention herein disclosed will occur to those skilled in the respective arts and all such modifications are deemed to be within the scope of the invention.

The invention claimed is:

1. A wafer container for holding a spaced stack of wafers, the stack having an axis extending through the centers of the wafers, each wafer having a circular peripheral edge and a thickness, the container comprising:
   a base portion for receiving the stack of wafers, the base portion having a plurality of walls defining an open interior and four of said walls defining an opening perimeter;
   a cover portion that cooperatively connects with the base portion to form a closed interior for containing the stack of wafers, the cover portion having an inside surface with attachment structure;
   a wafer cushion attached to the inside surface of the cover portion at the attachment structure, the wafer cushion having a length and a width, the length extending in a direction parallel to the axis of the stack of wafers, the wafer cushion comprising a pair of opposing side support structures and a central row of cantilevered wafer engaging finger portions extending from the opposing side support structures, each wafer engaging finger portion comprising a pair of legs extending from one of the two side support structures, the pair of legs extending to a mid-portion of the wafer engaging finger portion, the two legs joining at the mid-portion, the wafer engaging finger portion having a distal portion comprising a wafer engaging pad; and
   wherein each pair of legs of each wafer engaging finger portion defines a width and said width is a maximum width of the respective wafer engaging finger.

2. The wafer container of claim 1 wherein each wafer engaging pad is flared toward a distal tip, and wherein the two legs, the mid-portion and the wafer engaging portion have a bow tie shape.

3. The wafer container of claim 1 wherein each finger portion extends from the side support opposite that of an adjacent finger portion and wherein all of the finger portions are in vertical alignment.

4. The wafer container of claim 1 wherein each side support structure is integral to a row of ribs defining a row of slots, each slot having an associated finger portion.

5. The wafer container of claim 1, further comprising a H-bar carrier seated in the base portion and a base wafer cushion positioned below the H-bar carrier.

6. The wafer container of claim 5 wherein the base wafer cushion has a plurality of ribs defining a plurality of slots, each of the slots being defined by a bottom seating strip for seating one of the spaced stack of wafers, the bottom seating strip expanding at each of two ends of each slot providing a flare at each end.

7. A wafer container for holding a spaced stack of wafers, the stack having an axis extending through the centers of the wafers, each wafer having a circular peripheral edge and a thickness, the container comprising:
  a base portion for receiving the stack of wafers, the base portion having a plurality of walls defining an open interior and four of said walls defining an opening perimeter;
  a cover portion that cooperatively connects with the base portion to form a closed interior for containing the stack of wafers, the cover portion having an inside surface with attachment structure;
  a wafer cushion attached to the inside surface of the cover portion at the attachment structure, the wafer cushion having a length and a width, the length extending in a direction parallel to the axis of the stack of wafers, the wafer cushion comprising generally rectangular support structure defining a central elongate cushion window with a pair of opposing side support structures, a central row of cantilevered wafer engaging finger portions extending from the opposing side support structures down lengthwise in the window, each wafer engaging finger portion for engaging a single one of the stack of wafers, each wafer engaging finger portion comprising a pair of legs extending from one of the two side support structures, the pair of legs extending to a mid-portion of the wafer engaging finger portion, the two legs joining at the mid-portion, the wafer engaging finger portion having a distal portion comprising a wafer engaging pad;
  wherein each of the finger portions has a flared distal end that is positioned adjacent a narrowed portion of an adjacent finger portion.

8. A wafer container for holding a spaced stack of wafers, the stack having an axis extending through the centers of the wafers, each wafer having a circular peripheral edge and a thickness, the container comprising:
  a base portion for receiving the stack of wafers, the base portion having a plurality of walls defining an open interior and four of said walls defining an opening perimeter;
  a cover portion that cooperatively connects with the base portion to form a closed interior for containing the stack of wafers, the cover portion having an inside surface with attachment structure;
  a wafer cushion attached to the inside surface of the cover portion at the attachment structure, the wafer cushion having a length and a width, the length extending in a direction parallel to the axis of the stack of wafers, the wafer cushion comprising generally rectangular support structure defining a central elongate cushion window with a pair of opposing side support structures, a central row of cantilevered wafer engaging finger portions extending from the opposing side support structures down lengthwise in the window, each wafer engaging finger portion for engaging a single one of the stack of wafers, each wafer engaging finger portion comprising a pair of legs extending from one of the two side support structures, the pair of legs extending to a mid-portion of the wafer engaging finger portion, the two legs joining at the mid-portion, the wafer engaging finger portion having a distal portion comprising a wafer engaging pad;
  wherein each pair of legs of each wafer engaging finger defines a width and said width is a maximum width of the respective wafer engaging finger.

9. A wafer container for holding a spaced stack of wafers, the stack having an axis extending through the centers of the wafers, each wafer having a circular peripheral edge and a thickness, the container comprising:
  a base portion for receiving the stack of wafers, the base portion having a plurality of walls defining an open interior and four of said walls defining an opening perimeter;
  a cover portion that cooperatively connects with the base portion to form a closed interior for containing the stack of wafers, the cover portion having an inside surface with attachment structure;
  a wafer cushion attached to the inside surface of the cover portion at the attachment structure, the wafer cushion having a length and a width, the length extending in a direction parallel to the axis of the stack of wafers, the wafer cushion comprising generally rectangular support structure defining a central elongate cushion window with a pair of opposing side support structures, a central row of cantilevered wafer engaging finger portions extending from the opposing side support structures down lengthwise in the window, each wafer engaging finger portion for engaging a single one of the stack of wafers, each wafer engaging finger portion comprising a pair of legs extending from one of the two side support structures, the pair of legs extending to a mid-portion of the wafer engaging finger portion, the two legs joining at the mid-portion, the wafer engaging finger portion having a distal portion comprising a wafer engaging pad;
  wherein the wafer cushion comprises a pair of ribbed sections on opposing sides of the central row of wafer engaging finger portions and wherein each ribbed section comprising a plurality of slots and each slot having a bottom seating region for seating one of the wafers therein, each bottom seating region having a curvature and a pair of ends, each of the ends having a flare whereby the seating region flares outwardly at the ends.

10. A wafer container for holding a spaced stack of thin wafers having a diameter of one of 100 mm and 150 mm, and a thickness of 200 μm or less, the stack having an axis extending through the centers of the wafers, each wafer having a circular peripheral edge and a thickness, the container comprising:
  a H-bar carrier with a plurality of slots for the stack of wafers, the slots defining a wafer pitch,
  a base portion for receiving the H-bar wafer carrier therein with the stack of wafers, the base portion having a bottom wall upon which the H-bar wafer carrier seats and attachment structure,
  a base wafer cushion attached at the bottom wall positioned below the H-bar carrier, the wafer cushion having a plurality of ribs defining a plurality of slots corresponding to and aligned with the slots of the H-bar carrier, each slot having a bottom seating region for seating one of the wafers therein, each bottom seating region of each slot having a curvature and a pair of ends, a cover portion that cooperatively connects with the base portion to form a closed interior for enclosing the H-bar carrier with the stack of wafers, the cover portion having an uppermost wall with attachment structure thereon, and a cover wafer cushion secured to the attachment structure and defining slots corresponding with the slots in the H-bar carrier, the cover wafer cushion having a pair of side support structures with a row of cantilevered wafer engaging finger portions extending from the side supports, each wafer engaging finger portion for engaging a wafer, each wafer engaging finger portion comprising a pair of legs extending from one of the two side support structures, and having a distal portion comprising a wafer engaging pad, and wherein each pair of legs of each wafer engaging finger defines a width where the pair of legs connect to the respective side support structure and said width is a maximum width of the respective wafer engaging finger.

11. The combination of the wafer container and stack of thin wafers of claim 10 wherein the cover wafer cushion has a pair of support portions defining a wafer cushion window and wherein the row of wafer cushions extend into said window from said pair of support portions, and wherein each finger portion has a proximal portion, a mid portion, and a distal portion, and wherein each distal portion comprises two legs.

12. The wafer container and stack of thin wafers of claim 10, wherein each finger portion extends from a support portion in a direction opposite to that of an adjacent finger portion.

13. The wafer container and stack of thin wafers of claim 12 wherein each of the finger portions has a narrowed portion in the direction parallel to the axis of the stack of wafers and said narrowed portion is positioned next to a flared portion of an adjacent finger portion, the flared portion flared in a direction parallel to the axis of the stack of wafers.

14. The wafer container and stack of thin wafers of any one of claim 10 or 11 wherein each of the finger portions has a distal portion with a distal tip and with a slot for engaging a wafer, and each of the distal portions being flared in the direction toward the wafers with the maximum flare at or adjacent the distal tip.

15. The combination of the wafer container and stack of thin wafers of claim 10 wherein each of the finger portions has a proximal portion, a mid portion and a distal portion, and wherein each of the finger portions having an S-shape with the proximal portion having a concave curvature facing the wafers and the distal portion having a convex curvature facing the wafers.

16. The wafer container of claim 10 wherein each of the finger portions has a flex direction toward and away from the wafers the finger portion engages and wherein each finger portion tapers from the juncture of the finger portion to a neck portion, the taper in a direction transverse to the direction of flexing of each of the finger portions, and wherein each of the finger portions tapers from a distal portion to the neck portion, the taper also in the direction transverse to the direction of flexing of each of the finger portions.

17. The wafer container of claim 10 wherein each finger portion has a bow tie shape when viewed from the front of the wafer cushion.

18. The wafer container of claim 10 wherein the wafer container is in combination with the stack of thin wafers, the wafers having a diameter of one of 100 mm and 150 mm, and a thickness of about 200 µm or less.

19. A wafer container for holding a spaced stack of thin wafers, the stack having an axis extending through the centers of the wafers in a y direction of an x-y-z coordinate system, each wafer having a circular peripheral edge and a thickness, the container comprising:

a plurality of teethed sections defining slots for the stack of wafers, the slots defining a wafer pitch, the wafers received in the plurality of teeth in the z direction of the x-y-z coordinate system, a base portion having a base wall with attachment structure, a base wafer cushion attached at the base wall the wafer cushion having a plurality of ribs defining a plurality of slots each slot having a base seating region for seating one of the wafers therein, each bottom seating region of each slot having a curvature and a pair of ends, a cover portion that cooperatively connects with the base portion in the z direction, to form a closed interior for enclosing the stack of wafers, the cover portion having a wall with attachment structure thereon, a cover wafer cushion secured to the attachment structure and defining slots corresponding with the slots in the base seating cushion, the cover wafer cushion having a pair of side support portions with a row of cantilevered wafer engaging finger portions extending from the side support portions, each wafer engaging finger portion for engaging a wafer, each wafer engaging finger portion comprising a pair of legs extending from one of the two side support portions, and having a distal portion comprising a wafer engaging pad, and wherein each pair of legs of each wafer engaging finger portion defines a width where the pair of legs connect to the respective side support portion and said width is a maximum width of the respective wafer engaging finger.

20. The wafer container of claim 19 wherein each of the ends of each of the slots in the base wafer cushion have a flare whereby the seating region flares outwardly at the ends, the flare being in the z direction.

21. The wafer container of claim 19 wherein the pair of side support portions define a wafer cushion window and wherein the wafer engaging finger portions extend into said window from said pair of side support portions.

* * * * *